US012153096B2

(12) United States Patent
Sada et al.

(10) Patent No.: US 12,153,096 B2
(45) Date of Patent: Nov. 26, 2024

(54) REMAINING CAPABILITY EVALUATION METHOD FOR SECONDARY BATTERY, REMAINING CAPABILITY EVALUATION PROGRAM FOR SECONDARY BATTERY, COMPUTATION DEVICE, AND REMAINING CAPABILITY EVALUATION SYSTEM (71) Applicant: Panasonic Intellectual Property Management Co., Ltd., Osaka (JP)

(72) Inventors: Tomokazu Sada, Osaka (JP); Masatoshi Nagayama, Osaka (JP); Yukikazu Ohchi, Osaka (JP); Kazuya Hayayama, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 1045 days.

(21) Appl. No.: 16/978,549

(22) PCT Filed: Dec. 5, 2018

(86) PCT No.: PCT/JP2018/044666
§ 371 (c)(1),
(2) Date: Sep. 4, 2020

(87) PCT Pub. No.: WO2019/171688
PCT Pub. Date: Sep. 12, 2019

(65) Prior Publication Data
US 2021/0021000 A1   Jan. 21, 2021

(30) Foreign Application Priority Data
Mar. 7, 2018 (JP) ................. 2018-041115

(51) Int. Cl.
G01R 31/389 (2019.01)
G01R 31/36 (2020.01)
(Continued)

(52) U.S. Cl.
CPC ....... G01R 31/389 (2019.01); G01R 31/3648 (2013.01); G01R 31/367 (2019.01);
(Continued)

(58) Field of Classification Search
CPC .............. G01R 31/389; G01R 31/3648; G01R 31/367; G01R 31/392; G01R 31/396;
(Continued)

(56) References Cited

U.S. PATENT DOCUMENTS 9,678,167 B2 * 6/2017 Goto .................... G01R 31/392
10,001,528 B1   6/2018 Matsuyama et al.
(Continued)

FOREIGN PATENT DOCUMENTS

CN   107615562 A   1/2018
JP   2014-224706 A   12/2014

OTHER PUBLICATIONS

International Search Report issued in corresponding International Patent Application No. PCT/JP2018/044666, dated Feb. 26, 2019, with English translation.

*Primary Examiner* — Tung S Lau
(74) *Attorney, Agent, or Firm* — Rimon P.C.

(57) ABSTRACT

A deterioration diagnosis unit 21a of an arithmetic unit 20 constituting a remaining performance evaluation system 3 diagnoses the deterioration degree of a secondary battery 5 that has already been used for primary use based on an actual measurement value. The deterioration speed update unit 21b updates the deterioration speed of the secondary battery 5 based on the diagnosis result of the secondary battery 5. The remaining performance estimation unit 21c estimates the remaining performance of the secondary battery 5 after the start of secondary use based on the updated deterioration speed and a usage method at the time of the secondary use of the secondary battery 5.

12 Claims, 4 Drawing Sheets (51) Int. Cl.
  *G01R 31/367*  (2019.01)
  *G01R 31/392*  (2019.01)
  *G01R 31/396*  (2019.01)
  *H01M 10/48*  (2006.01)
  *H02J 7/00*  (2006.01)

(52) U.S. Cl.
  CPC ......... *G01R 31/392* (2019.01); *G01R 31/396* (2019.01); *H01M 10/48* (2013.01); *H02J 7/0013* (2013.01); *H02J 7/0048* (2020.01); *H02J 7/005* (2020.01)

(58) Field of Classification Search
  CPC ................ G01R 31/382; H01M 10/48; H01M 2220/20; H01M 10/052; H01M 10/441; H01M 50/249; H02J 7/0013; H02J 7/0048; H02J 7/005; Y02T 10/70; B60L 58/16; Y02E 60/10
  See application file for complete search history.

(56) References Cited

U.S. PATENT DOCUMENTS

| | | | |
|---|---|---|---|
| 2016/0254680 A1* | 9/2016 | Arai ...................... | H01M 10/44 320/107 |
| 2018/0156873 A1 | 6/2018 | Matsuyama et al. | |
| 2020/0395775 A1* | 12/2020 | Hayayama .......... | H02J 7/00712 |

* cited by examiner

REMAINING CAPABILITY EVALUATION METHOD FOR SECONDARY BATTERY, REMAINING CAPABILITY EVALUATION PROGRAM FOR SECONDARY BATTERY, COMPUTATION DEVICE, AND REMAINING CAPABILITY EVALUATION SYSTEM

CROSS-REFERENCE OF RELATED APPLICATIONS

This application is the U.S. National Phase under 35 U.S.C. § 371 of International Patent Application No. PCT/JP2018/044666, filed on Dec. 5, 2018, which in turn claims the benefit of Japanese Application No. 2018-041115, filed Mar. 7, 2018, the entire disclosures of which Applications are incorporated by reference herein.

TECHNICAL FIELD

The present invention relates to a secondary battery remaining performance evaluation method, a secondary battery remaining performance evaluation program, an arithmetic unit, and a remaining performance evaluation system for evaluating the remaining performance of a secondary battery that has already been used for primary use.

BACKGROUND ART

In recent years, secondary batteries such as lithium-ion batteries and nickel hydrogen batteries are used for various purposes. For example, the secondary batteries are used in in-vehicle application for supplying electric power to traction motors of electric vehicles (EVs), hybrid electric vehicles (HEVs), and plug-in hybrid vehicles (PHVs), power storage application for peak shift and backup, frequency regulation (FR) application for stabilizing the frequencies of systems, and so on.

With an increase in the life of secondary batteries, switching of the purpose (for example, switching from in-vehicle application to stationary-type power storage application) before the end of the life of the secondary batteries is expected to increase. Therefore, the need to estimate the remaining performance, such as the remaining life of secondary batteries before the secondary use of the secondary batteries after being used for the primary use, is expected to increase in the future. The primary use of a secondary battery is the use according to the initial usage method, and the secondary use of a secondary battery is the use according to the usage method changed from the initial usage method. In principle, the purpose is different between the primary use and the secondary use. However, even for the same purpose, when the usage method is changed to a usage method with less burden, the use after the change corresponds to the secondary use.

In regard to this, a method has been proposed for estimating the degree of deterioration and remaining life of a secondary battery by storing the temperature of the secondary battery during the primary use and the history of the state of charge (SOC), taking over the storage deterioration amount at the time of the primary use to the secondary use so as to estimate the storage deterioration amount, and adding cycle deterioration that is estimated separately (for example, see Patent Document 1). The storage deterioration is based on the premise that the deterioration progresses in proportion to the square root of time, and the cycle deterioration is based on the premise that the deterioration progresses linearly with respect to the integrated current amount/electric energy.

PATENT LITERATURE

[PATENT LITERATURE 1] PCT International Publication No. WO2016/194082

SUMMARY OF INVENTION

Technical Problem

However, the actual storage deterioration of a secondary battery does not always progress in proportion to the square root of time. For example, there are cases where the deterioration progresses in proportion to the 0.4 power law of time and cases where the deterioration progresses in proportion to the 0.6 power law of time. Further, the actual cycle deterioration of the secondary battery does not always progress linearly with respect to the integrated amount of current/electrical power. For example, the deterioration may progress in proportion to the 0.9 power law of the integrated amount of current/electrical power.

In this background, a purpose of the present disclosure is to provide a technique for highly accurately estimating the remaining performance of a secondary battery that has already been used for primary use.

Means to Solve the Problem

A secondary battery remaining performance evaluation method according to one embodiment of the present disclosure includes: diagnosing the deterioration degree of a secondary battery that has already been used for primary use based on an actual measurement value; updating the deterioration speed of the secondary battery based on the diagnosis result of the secondary battery; and estimating the remaining performance of the secondary battery after the start of secondary use based on the updated deterioration speed and a usage method at the time of the secondary use of the secondary battery.

Optional combinations of the aforementioned constituting elements, and implementations of the present disclosure in the form of methods, apparatuses, and systems may also be practiced as additional modes of the present disclosure.

Advantage of the Present Invention

According to the present disclosure, the remaining performance of a secondary battery that has already been used for primary use can be highly accurately estimated.

MODE FOR CARRYING OUT THE INVENTION

An embodiment of the present disclosure relates to the reuse of a secondary battery. In the present embodiment, when the primary use of a secondary battery is completed, the secondary battery is collected, and deterioration diagnosis is performed on the secondary battery without disassembling the secondary battery. Based on the result of the deterioration diagnosis, the remaining performance of the secondary battery at the time of secondary use is estimated. Hereinafter, an example is assumed where a lithium ion secondary battery is used as the secondary battery in the present embodiment.

Figure 1:
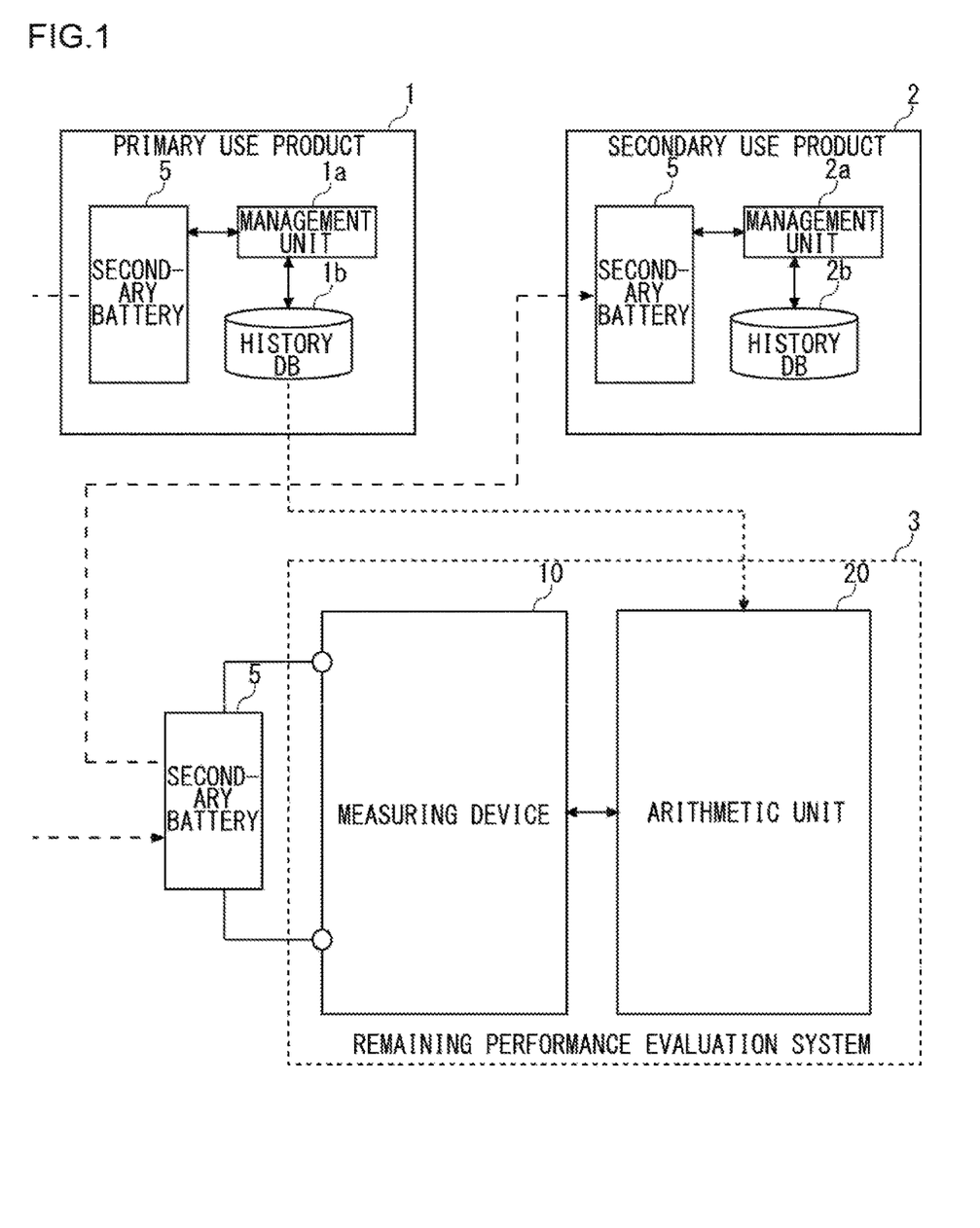
FIG. 1 is a diagram for explaining a life cycle of a secondary battery according to an embodiment of the present disclosure.

FIG. 1 is a diagram for explaining a life cycle of a secondary battery 5 according to the embodiment of the present disclosure. First, the secondary battery 5 is used while being mounted on a primary use product 1. The primary use product 1 is, for example, an EV, HEV, or PHV, and the secondary battery 5 is used as a vehicle driving battery. The primary use product 1 includes a management unit 1a and a history database 1b.

The deterioration state of the secondary battery 5 is generally defined by State Of Health (SOH). SOH is defined by the ratio of the current full charge capacity to the initial full charge capacity, and the lower the value thereof (the closer to 0%), the more the deterioration is progressing. That is, SOH indicates a capacity retention rate, and (1−SOH) indicates a capacity deterioration rate.

Constant deterioration of the secondary battery 5 can be approximated by the sum of storage deterioration and cycle deterioration. The storage deterioration is deterioration that progresses over time depending on the temperature of the secondary battery 5 at each point of time and the SOC at each point of time, regardless of whether the secondary battery 5 is being charged or discharged or not being charged or discharged. The storage deterioration mainly occurs due to the formation of a coating film (solid electrolyte interphase (SEI) film) on the negative electrode. Generally, the storage deterioration progresses according to the 0.5 power law (square root) of time t as shown in the following (Equation 1). The storage deterioration depends on the state of charge (SOC) and the temperature T at each point of time. Generally, the higher the SOC at each point of time (closer to 100%) and the higher the temperature T at each point of time, the higher the deterioration speed k.

$$\text{Capacity deterioration rate due to storage deterioration} = tn \times k(T, SOC) \quad \text{(Equation 1)}$$

k(T,SOC) indicates the deterioration speed of the storage deterioration. n is normally 0.5.

The cycle deterioration is deterioration that progresses as the number of times of charging and discharging increases. The cycle deterioration occurs due to cracking, peeling, or the like caused due to expansion/contraction of an active material. As shown in the following equation (2), the cycle deterioration generally progresses according to the first power law (linear) of the charging and discharging progress degree. A charging and discharging progress degree c. can be defined by any one of a cycle count (the number of times of charging and discharging), a cumulative charging current amount [Ah], a cumulative discharging current amount [Ah], the sum of the absolute values of the both [Ah], cumulative charging electric energy [Wh], cumulative discharging electric energy [Wh], and the sum of the absolute values of the both [Wh]. When the charging and discharging progress degree c. is defined based on the cycle count, if a SOC range used during charging and discharging is constant, the cycle count can be used directly as the charging and discharging progress degree c. If the SOC range used during the charging and discharging varies, a value obtained by correcting the number of times of charging and discharging within the SOC range actually used during the charging and discharging is used for the charging and discharging progress degree c. The cycle deterioration depends on the SOC range that is used, the temperature T, and a current rate C. Generally, the wider the SOC range that is used and the higher the temperature T and the current rate C, the more the deterioration speed k increases.

$$\text{Capacity deterioration rate due to cycle deterioration} = cn \times k(T, SOC\ \text{range}, C) \quad \text{(Equation 2)}$$

k(T,SOC range,C) indicates the deterioration speed of the cycle deterioration. n is normally 1.

The manufacturer of the secondary battery 5 evaluates secondary batteries of the same type as the secondary battery 5 in advance before shipping the secondary battery 5, and derives the deterioration speed of the storage deterioration and the deterioration speed of the cycle deterioration. The manufacturer of the secondary battery 5 carries out a storage test of the secondary battery while changing the SOC condition and the temperature condition so as to derive the deterioration speed of the storage deterioration. A power law n for changing the capacity deterioration rate linearly is derived at that time. Generally, the deterioration speed of the storage deterioration is the 0.5 power law of the storage time t. However, in reality, the value varies and may be close to 0.4 or close to 0.6.

The manufacturer of the secondary battery 5 carries out a charging and discharging test of the secondary battery while changing the condition of the SOC range that is used, the temperature condition, and the current rate condition so as to derive the deterioration speed of the cycle deterioration. The power law n for changing the capacity deterioration rate linearly is derived at that time. Generally, the deterioration speed of the cycle deterioration is based on the 1 power law of the charging and discharging progress degree c. However, in reality, the value may be less than 1.

The manufacturer of the secondary battery 5 acquires model data of the usage method and usage environment of the secondary battery 5 during the primary use period, and substitutes the model data into the above Equation 1 and Equation 2. As described above, the deterioration speed of the storage deterioration depends on the SOC and the temperature T, and the deterioration speed of the cycle deterioration depends on the SOC range, the temperature T, and the current rate C. The deterioration speed of the storage deterioration and the deterioration speed of the cycle deterioration are derived by substituting the model data for the primary use period into each of the parameters. The scale of the deterioration speed of the storage deterioration and the scale of the deterioration speed of the cycle deterioration in the horizontal axis are each converted into time, and the capacity deterioration rate of the deterioration speed of the storage deterioration and the capacity deterioration rate of the deterioration speed of the cycle deterioration in the vertical axis are added up so as to estimate a deterioration prediction curve (transition) of the secondary battery 5. By setting the point of time at which the capacity deterioration rate reaches a predetermined value as an end point, the life of the secondary battery 5 can be estimated.

The manufacturer of the secondary battery 5 registers a storage deterioration map for each usage method and usage environment of the secondary battery 5, a cycle deterioration map, and the deterioration prediction curve of the secondary battery 5 that are derived in a primary use deterioration database 22a of an arithmetic unit 20 of a remaining performance evaluation system 3.

The management unit 1a of the primary use product 1 manages the secondary battery 5 mounted on the primary use product 1. The management unit 1a records the operation history of the secondary battery 5 in the history database 1b. More specifically, the management unit 1a records the upper limit SOC, the lower limit SOC, a charging rate, and a discharging rate at the time of the charging and discharging operation of the secondary battery 5 together with time information. The management unit 1a also records the SOC, the temperature, and the rest time of the secondary battery 5 in a resting state, together with the time information.

When the primary use of the secondary battery 5 is ended, the secondary battery 5 is removed from the primary use product 1 and used for deterioration diagnosis. The end of the primary use of the secondary battery 5 comes, for example, when the primary use product 1 is traded in or the battery is replaced. The deterioration diagnosis of the secondary battery 5 that has already been used for the primary use is carried out in a store of a car dealer, a store of the manufacturer or a used car distributor, or a factory. The deterioration diagnosis of the secondary battery 5 is performed using the remaining performance evaluation system 3.

The remaining performance evaluation system 3 includes a measuring device 10 and an arithmetic unit 20. The measuring device 10 is a device that measures the state of the secondary battery 5 that has already been used for the primary use, without the disassembling of the secondary battery 5. The arithmetic unit 20 is a device that diagnoses the deterioration state of the secondary battery 5 that has already been used for the primary use based on the data measured by the measuring device 10 and evaluates the remaining performance of the secondary battery 5 that has already been used for the primary use.

The measuring device 10 and the arithmetic unit 20 may be dedicated devices configured integrally inside a single housing or may be configured by a combination of a dedicated measuring device 10 and a general-purpose arithmetic unit 20. As the general-purpose arithmetic unit 20, for example, a PC, a server, a tablet terminal, a smartphone or the like can be used. The general-purpose arithmetic unit 20 and the dedicated measuring device 10 are connected by a USB cable or the like. The two may be connected wirelessly by a wireless LAN, Bluetooth (registered trademark), or the like.

The arithmetic unit 20 may also be a server installed in the cloud. In that case, the measuring device 10 and the arithmetic unit 20 are connected via the Internet or a dedicated line.

As a result of the diagnosis by the remaining performance evaluation system 3, when the remaining performance amount of the secondary battery 5 that has been used for the primary use is equal to or more than a predetermined amount, the secondary battery 5 is subjected to secondary use. The secondary use product 2 is, for example, a stationary-type power storage system, and the secondary battery 5 is used as, for example, a battery for backup. The secondary use product 2 includes a management unit 2a and a history database 2b.

The secondary battery 5 at the time of the secondary use is used according to a usage method requiring a lighter load than that at the time of the primary use. More specifically, for the application of the secondary battery 5 in the secondary use, at least one of a lower upper limit of the used SOC range, a higher lower limit of the used SOC range, a lower charging rate, a lower discharging rate, and a longer resting time than those in the application in the primary use is satisfied.

An in-vehicle application for the primary use and a stationary power storage application for the secondary use are examples, and the present disclosure is not limited to these examples. For example, the primary use product 1 may be a vehicle equipped with a large motor, and the secondary use product 2 may be a vehicle equipped with a small motor. Further, the primary use product 1 may be a stationary-type power storage system used for FR applications, and the secondary use product 2 may be a stationary-type power storage system used for a backup application. In either case, the load on the secondary battery 5 is lighter during the secondary use than that during the primary use.

Figure 2:
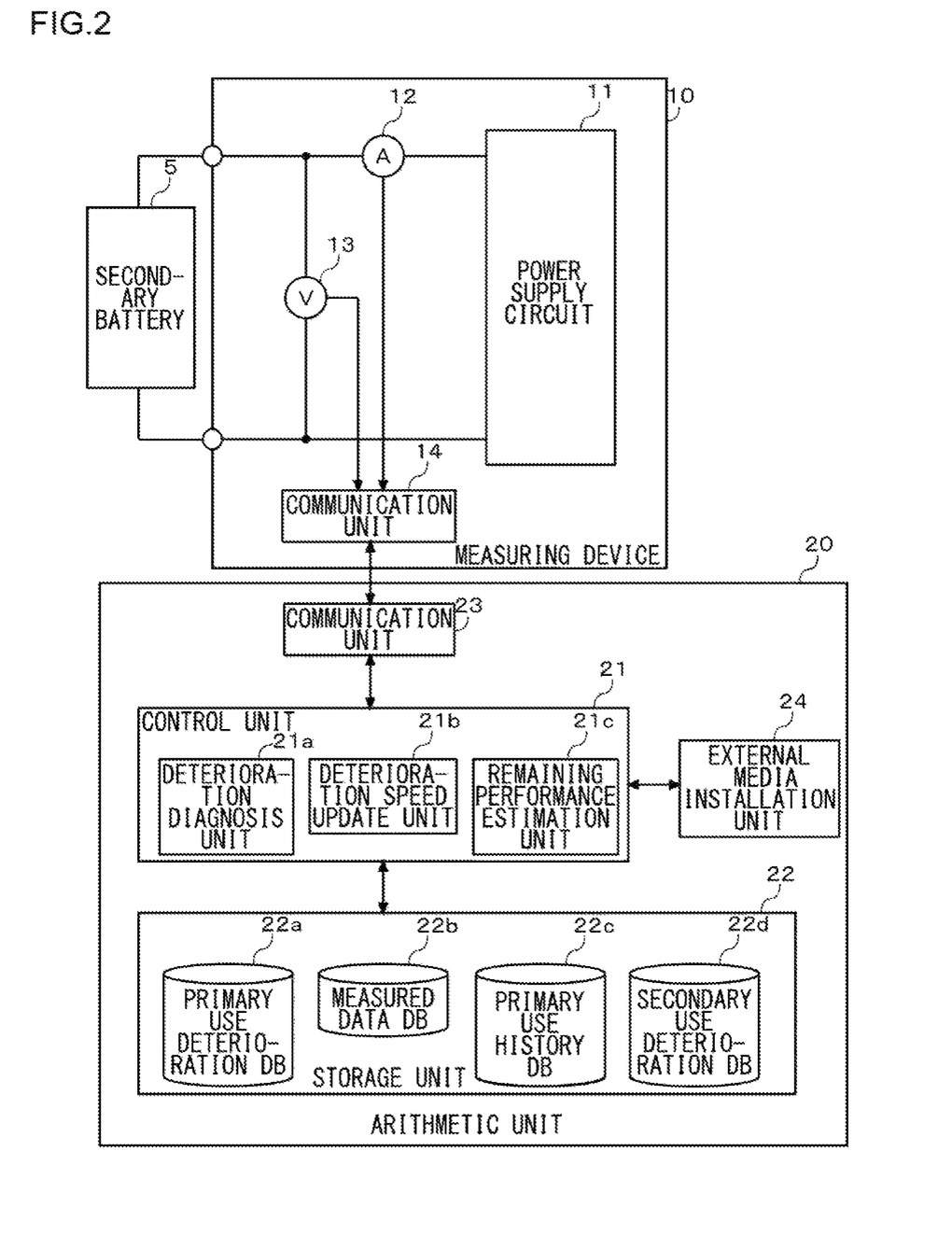
FIG. 2 is a diagram showing an configuration example of a remaining performance evaluation system according to the embodiment of the present disclosure.

FIG. 2 is a diagram showing a configuration example of a remaining performance evaluation system 3 according to the embodiment of the present disclosure. The measuring device 10 includes a power supply circuit 11, a current sensor 12, a voltage sensor 13, and a communication unit 14. The power supply circuit 11 can charge or discharge the secondary battery 5 connected to the measuring device 10 at a predetermined voltage value or a predetermined current value. When the measuring device 10 is equipped with an oscillator, the power supply circuit 11 can charge or discharge the secondary battery 5 with alternating-current power having a predetermined frequency.

The current sensor 12 measures the current flowing through the secondary battery 5 and outputs the measured current to the communication unit 14. For the current sensor 12, for example, a combination of a shunt resistor/hall element and a differential amplifier, or a CT sensor can be used. The voltage sensor 13 measures the voltage of the secondary battery 5 and outputs the measured voltage to the communication unit 14. For the voltage sensor 13, for example, a differential amplifier can be used. Although not shown in FIG. 2, the measuring device 10 also includes a temperature sensor for detecting a temperature change of the secondary battery 5 at the time of measurement. For example, a thermistor can be used as the temperature sensor.

The communication unit 14 transmits the current measured by the current sensor 12, the voltage measured by the voltage sensor 13, and the temperature measured by the temperature sensor to the arithmetic unit 20 according to a predetermined communication standard. A data logger for keeping the measured data may be mounted on the measuring device 10 side.

The arithmetic unit 20 includes a control unit 21, a storage unit 22, a communication unit 23, and an external media installation unit 24. The control unit 21 includes a deterioration diagnosis unit 21a, a deterioration speed update unit 21b, and a remaining performance estimation unit 21c. The function of the control unit 21 can be realized by cooperation of hardware resources and software resources, or only by hardware resources. CPUs, GPUs, DSPs, FPGAs, ROMs, RAMs, and other LSIs can be used as the hardware resources. Programs such as operating systems and applications can be used as the software resources.

The storage unit 22 includes a primary use deterioration database 22a, a measured data database 22b, a primary use history database 22c, and a secondary use deterioration database 22d. The storage unit 22 includes a large-capacity non-volatile memory such as HDD and SSD.

The communication unit 23 executes a communication process according to a predetermined communication standard. The communication unit 23 receives measured data transmitted from the communication unit 14 of the measuring device 10 and outputs the measured data to the control unit 21. The control unit 21 stores the measured data input from the communication unit 14 in the measured data database 22b.

The communication unit 23 can be connected to a data management device (for example, server or PC) of the manufacturer of the secondary battery 5 via the Internet or a dedicated line. The communication unit 23 can receive, for example, a storage deterioration map, a cycle deterioration map, and a deterioration prediction curve of the secondary battery 5 pre-evaluated by the manufacturer of the secondary battery 5 from the data management device of the manufacturer of the secondary battery 5. The communication unit 23 outputs the received storage deterioration map, cycle deterioration map, and deterioration prediction curve of the secondary battery 5 to the control unit 21. The control unit 21 stores the storage deterioration map, the cycle deterioration map, and the deterioration prediction curve of the secondary battery 5 input from the communication unit 14 in the primary use deterioration database 22a.

The external media installation unit 24 is a unit for installing a removable medium. The removable medium is a recording medium that can be attached to and detached from the external media installation unit 24, and corresponds to, for example, a semiconductor memory card, an optical disc, or the like. The storage deterioration map, the cycle deterioration map, and the deterioration prediction curve of the secondary battery 5, which have been pre-evaluated by the manufacturer of the secondary battery 5, described above may be imported into the arithmetic unit 20 via the removable medium.

Further, the operation history of the secondary battery 5 during the primary use period recorded in the history database 1b of the primary use product 1 can be imported into the arithmetic unit 20 via the removable medium. The control unit 21 reads the operation history of the secondary battery 5 during the primary use period from the removable medium installed in the external media installation unit 24 and stores the operation history in the primary use history database 22c. The operation history of the secondary battery 5 during the primary use period may be imported from the communication unit 23 into the arithmetic unit 20 through communication with the primary use product 1.

In the present embodiment, it is not necessary to import the operation history of the secondary battery 5 during the primary use period. When the operation history is not imported, the primary use history database 22c in the storage unit 22 is unnecessary.

The deterioration diagnosis unit 21a measures the capacity of the secondary battery 5 that has already been used for the primary use. The secondary battery 5 that has already been used for the primary use is charged from a completely discharged state to the full charge capacity, and the current full charge capacity is measured. The current total SOH of the secondary battery 5 can be measured based on the ratio between the measured current full charge capacity and the initial full charge capacity.

Further, the deterioration diagnosis unit 21a executes at least one of dV/dQ measurement, alternating current impedance measurement, and direct current resistance measurement, and, based on the result of the execution, the deterioration diagnosis unit 21a diagnoses the details of the deterioration degree of storage deterioration and cycle deterioration of the secondary battery 5. In the dV/dQ measurement, the secondary battery 5 is charged or discharged so as to generate a charge curve/discharge curve defined by the relationship between a voltage V and charge/discharge capacity Q. In the generated charge curve/discharge curve, the voltage V is differentiated by the capacity Q so as to generate a dV/dQ curve. The reaction distribution and the deterioration state in an electrode can be estimated from the peak shape, the shift amount, the distance between peaks, etc., of the dV/dQ curve. For example, the effect of the cycle deterioration appears in the expansion and contraction of the dV/dQ curve itself. The effect of the storage deterioration appears in the shift amount of the dV/dQ curve. The amount of lithium dissolved as ions and precipitated as a metal can be estimated based on the dV/dQ curve.

In the alternating current impedance measurement, the alternating-current voltage is applied to the secondary battery 5 while sweeping the frequency in a wide range from a low frequency to a high frequency, and the internal resistance is measured based on the response current thereof. The internal resistance of the secondary battery 5 mainly includes a positive electrode resistance component, a negative electrode resistance component, an electrolyte resistance component, and a diffusion resistance component. The internal resistance measured from the response current is plotted on a complex plane, and each of the resistance components is identified and separated based on the shapes and sizes of a plurality of arcs on the complex plane. As described, in the alternating current impedance measurement, it is possible to separate reactions with different time constants.

As described above, the storage deterioration mainly occurs due to the formation of a coating film (SEI film) on the negative electrode. The internal resistance of the negative electrode has a correlation with the thickness of the negative electrode coating film, and the deterioration degree of the storage deterioration of the secondary battery 5 can be estimated from the internal resistance of the negative electrode. Since the total SOH of the secondary battery 5 is known from the capacity measurement, the deterioration degree of the cycle deterioration can be estimated by subtracting the deterioration degree of the storage deterioration from the total deterioration degree of the secondary battery 5.

For the direct current resistance measurement, a time-voltage waveform obtained from a direct current response (DCIR) when the secondary battery 5 is charged or discharged at a constant current is used so as to separate and extract combined resistance of the electrolyte plus the negative electrode, positive electrode resistance, and diffusion resistance. Frequency response (ACIR) and time response (DCIR) have the relationship described by the Fourier transform. For example, the resistance component of the electrolyte plus negative electrode that responds at a high frequency at the time of alternating current application appears as a voltage behavior that responds early after the start of application at the time of direct current application.

In a commonly-used lithium-ion battery, the frequency response of negative electrode resistance occurs in a range of 100 Hz to 1 Hz. The time response occurs in a range of 0.01 second to 1 second. For example, when the frequency response of the negative electrode resistance is around 10 Hz, a point of time at which 0.1 seconds has elapsed after the start of direct current application is set as a boundary point between the positive electrode resistance and the negative electrode resistance plus the electrolyte resistance. In a commonly-used lithium-ion battery, the frequency response of the electrolyte resistance appears around 1 kHz. A point of time at which 0.001 seconds has elapsed after the start of direct current application is set as a boundary point between the negative electrode resistance and the electrolyte resistance. Further, in the diffusion resistance component, voltage appears as a behavior of a linear function with respect to the 0.5 power law (square root) of time. Accordingly, a change point at which an increase in voltage changes from a curved line to a straight line serves as a boundary point between the positive electrode resistance and the diffusion resistance.

When the voltage sensor 13 that can measure the voltage in units of 0.001 seconds with high accuracy is used, the internal resistance of the negative electrode can be also measured by the direct current resistance measurement with the accuracy equivalent to that in the alternating current impedance measurement. As described above, the deterioration degree of the storage deterioration of the secondary battery 5 can be estimated from the internal resistance of the negative electrode.

The diffusion resistance of each composition may be measured by performing the galvanostatic intermittent titration technique (GITT) measurement along with the alternating current impedance measurement or the direct current resistance measurement explained above.

When the measuring device 10 is equipped with an X-ray imaging function, by imaging the secondary battery 5 using X-ray, the thickness of the negative electrode coating film inside the secondary battery 5 may be estimated based on the thickness of the negative electrode coating film in an X-ray transmission image. When the measuring device 10 is equipped with a sound wave analysis function, the thickness of the negative electrode coating film can be estimated by detecting the resonance frequency of the negative electrode. As described above, the thickness of the negative electrode coating film has a correlation with the internal resistance of the negative electrode, and the deterioration degree of the storage deterioration of the secondary battery 5 can be estimated from the thickness of the negative electrode coating film.

In order to use the secondary battery 5 for the secondary use, it is necessary to measure the amount of the electrolyte without disassembling the secondary battery 5. As described above, the frequency response of the electrolyte resistance appears around 1 kHz. Thus, by applying an alternating current signal around 1 kHz to the secondary battery 5 and measuring the internal resistance, the amount of the electrolyte can be estimated without disassembling the secondary battery 5.

The weight of the secondary battery 5 may be measured as a deterioration diagnosis. When gas is generated due to the decomposition of the electrolyte, the amount of the electrolyte is reduced and the weight of the secondary battery 5 is reduced. Therefore, the amount of the electrolyte can be estimated from the weight of the secondary battery 5.

The decrease in the electrolyte causes sudden deterioration of the capacity. After the sudden deterioration of the capacity, the input and output performance is significantly decreased. Further, lithium dissolved as ions is more likely to be precipitated as a metal. When metallic lithium is precipitated, metallic lithium may penetrate the separator and short-circuit the positive electrode and the negative electrode. As described, after the sudden deterioration of the capacity, the stability and safety of the secondary battery 5 are decreased, and thus the use of the secondary battery 5 is basically terminated.

Before the secondary use of the secondary battery 5 that has been subjected to the deterioration diagnosis is performed, the deterioration speed update unit 21b acquires the model data of the usage method and the usage environment of the secondary battery 5 during the secondary use period and derives the deterioration speed of the storage deterioration and the deterioration speed of the cycle deterioration of the secondary battery 5 during the secondary use period by substituting the model data in the above Equation 1 and Equation 2. The deterioration speed update unit 21b can calculate the deterioration degree of the total storage deterioration during the primary use period and the secondary use period by the following Equation 3. The deterioration speed update unit 21b can calculate the deterioration degree of the total cycle deterioration during the primary use period and the secondary use period by the following Equation 4.

$$\text{total capacity deterioration rate due to storage deterioration} = ((t1n \times k(T1, SOC1))1/n + (t2n \times k(T2, SOC2))1/n)n \quad \text{(Equation 3)}$$

wherein t1 is the elapsed time in the primary use period, k(T1,SOC1) is the deterioration speed of the storage deterioration in the primary use period, t2 is the elapsed time in the secondary use period, and k(T2,SOC2) is the deterioration speed of the storage deterioration in the secondary use period.

$$\text{total capacity deterioration rate due to cycle deterioration} = ((c1n \times k(T1, SOC \text{ range } 1, C1))1/n + (c2n \times k(T2, SOC \text{ range } 2, C2))1/n)n \quad \text{(Equation 4)}$$

wherein c1 is a charging and discharging cycle in the primary use period, k(T1,SOC range 1,C1) is the deterioration speed of the cycle deterioration in the primary use period, c2 is a charging and discharging cycle in the secondary use period, k(T2,SOC range 2,C2) is the deterioration speed of the cycle deterioration in the secondary use period.

As described, in order to carry over the deterioration of the n-th power law from the primary use to the secondary use, the deterioration degrees are raised to the 1/n-th power, added up, and then raised to the n-th power. Thereby, with respect to deterioration of arbitrary n-th power law, the deterioration during the primary use can be carried over to the deterioration during the secondary use. As in general cycle deterioration, when n is 1, the deterioration degree during the primary use and the deterioration degree during the secondary use need to be simply added up. When the deterioration power law of the cycle deterioration is other than 1, calculation using the above Equation 4 is necessary.

The respective parameter values of the temperature T2, SOC2, SOC range 2, and current rate C2 of the secondary battery 5 during the secondary use period are determined based on the model data of the usage method and usage environment of the secondary battery 5 during the secondary use period. The respective parameter values of the temperature T1, SOC1, SOC range 1, and current rate C1 during the primary use period are determined based on the operation history data stored in the primary use history database 22c. When the operation history data is not acquired from the primary use product 1, the parameter values are determined based on the model data of the usage method and usage environment of the secondary battery 5 during the primary use period.

In the method explained above, the deterioration degree of the storage deterioration and the deterioration degree of the cycle deterioration during the primary use period are estimated based on the operation history data or the model data. In the present embodiment, in order to more accurately determine the deterioration degree of the storage deterioration and the deterioration degree of the cycle deterioration during the primary use period, the deterioration degree of the storage deterioration and the deterioration degree of the cycle deterioration during the primary use period are determined based on the result of the deterioration diagnosis performed before the secondary use of the secondary battery 5.

The remaining performance estimation unit 21c substitutes the deterioration degree of the storage deterioration and the deterioration degree of the cycle deterioration at the time of diagnosis determined by the deterioration diagnosis of the secondary battery 5 for the value of t1n×k(T1,SOC1) in the above Equation 3 and the value of c1n×k(T1,SOC range 1,C1) in the above Equation 4, respectively. The remaining performance estimation unit 21c converts the respective scales of the deterioration degree of the storage deterioration and the deterioration degree of the cycle deterioration in the horizontal axis into time, and adds up the respective capacity deterioration rates of the deterioration speed of the storage deterioration and the deterioration speed of the cycle deterioration in the vertical axis so as to estimate a total deterioration prediction curve for the primary use period and the secondary use period of the secondary battery 5.

When the secondary battery 5 is formed using a module in which a plurality of cells are connected in series or in parallel, variation may occur in the SOC of the plurality of cells in the module. Usually, the deterioration speed of the cycle deterioration is derived based on single cell data. In the case of a module, it is premised that a plurality of cells included in the module operate in a uniform SOC range. If variation occurs in the used SOC range among the plurality of cells in the module, this premise becomes invalid.

The remaining performance estimation unit 21c acquires each used SOC range of the plurality of cells included in the module from the operation history data stored in the primary use history database 22c. The remaining performance estimation unit 21c follows the OR condition of the used SOC ranges of all the cells and determines the used SOC range of the module. That is, of the used SOC ranges of all the cells, a range defined by the maximum upper limit value and the minimum lower limit value is determined as the used SOC range of the module.

The remaining performance estimation unit 21c corrects the used SOC range of the secondary battery 5 included in the model data of the usage method and usage environment of the secondary battery 5 in the secondary use period in accordance with the above used SOC range of the module. When the used SOC range included in the model data of the primary use period and the used SOC range included in the model data of the secondary use period are the same, the above used SOC range of the module is set to the SOC range 2 in the secondary use period. When the used SOC range included in the model data of the primary use period and the used SOC range included in the model data of the secondary use period are different, a value obtained by multiplying the used SOC range included in the model data of the secondary use period by the ratio between the used SOC range included in the model data of the primary use period and the above used SOC range of the module is set to the SOC range 2 of the secondary use period.

Estimating the deterioration degree of the cycle deterioration by using the most widely estimated SOC range (which is the SOC range where the cycle deterioration is the largest) defined by the OR condition of the used SOC range of all the cells included in the module allows the deterioration degree of the cycle deterioration to be prevented from being estimated lower than the actual degree.

The remaining performance estimation unit 21c may determine the range defined by the average value of the upper limit values and the average value of the lower limit values of the used SOC ranges of all the cells included in the module as the used SOC range of the module. Further, the remaining performance estimation unit 21c may determine the range defined by the median value of the upper limit value and the median value of the lower limit value of the used SOC ranges of all the cells included in the module as the used SOC range of the module. In these cases, the deterioration degree of the cycle deterioration can be estimated based on the used SOC range that is closer to the actual range.

Figure 3:
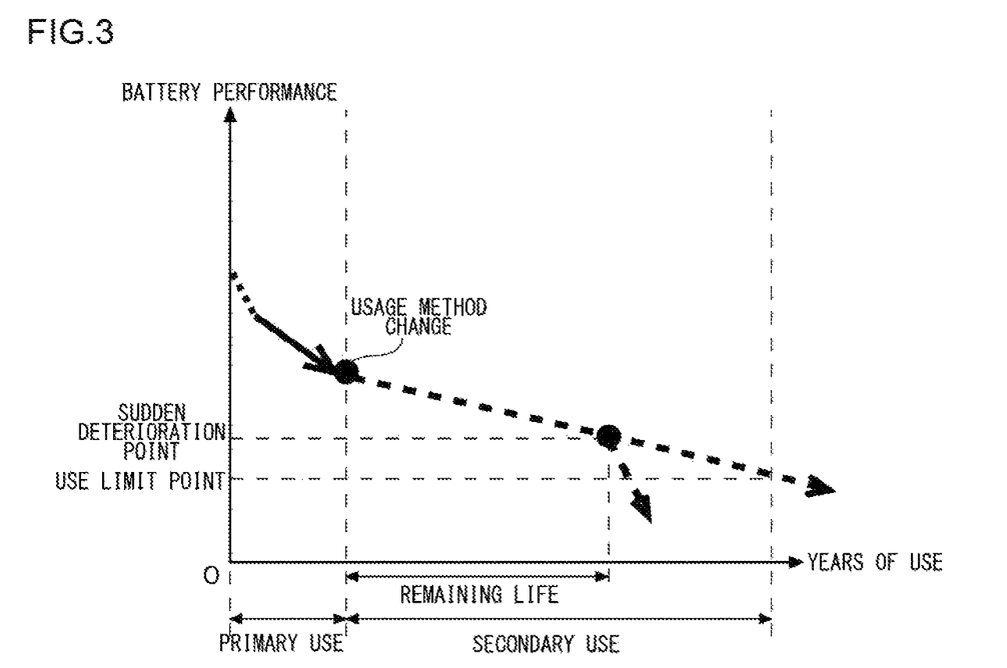
FIG. 3 is a diagram showing an example of a total deterioration prediction curve for a primary use period and a secondary use period of a secondary battery.

FIG. 3 is a diagram showing an example of a total deterioration prediction curve for the primary use period and the secondary use period of the secondary battery 5. The battery performance on the vertical axis can be represented by, for example, SOH. When the usage method of the secondary battery 5 is changed to a usage method requiring a lighter load than the usage method used during the primary use after the completion of the primary use of the secondary battery 5, the deterioration speed of the secondary battery 5 is lowered. The remaining performance estimation unit 21c sets the point of time at which the battery performance of the secondary battery 5 reaches a predetermined value (for example, SOH 60%) as a use limit point. The remaining performance estimation unit 21c estimates the period from when the secondary use of the secondary battery 5 is started until when the use limit point is reached.

Further, the remaining performance estimation unit 21c estimates the period from when the secondary use of the secondary battery 5 is started until when a sudden deterioration point is reached. As described above, in a commonly-used lithium-ion battery, the frequency response of the electrolyte resistance appears around 1 kHz. In the preliminary evaluation, the battery manufacturer of the secondary battery 5 derives the rate of change of an internal resistance value when an alternating current signal of 1 kHz is applied. Further, the manufacturer derived the resistance threshold value at which the secondary battery 5 reaches the sudden deterioration point. In general, the resistance threshold value at which the sudden deterioration point is reached is often in a range of 20 to 40 mQ.

The remaining performance estimation unit 21c estimates the period from when the secondary use of the secondary battery 5 is started until when the sudden deterioration point is reached based on the internal resistance value obtained when an alternating current signal of 1 kHz measured in the deterioration diagnosis of the secondary battery 5 is applied, the rate of change of the internal resistance value obtained when an alternating current signal of 1 kHz is applied, which is derived in advance, and the resistance threshold value at which the sudden deterioration point of the secondary battery 5 is reached. Further, in the primary use product 1, when the internal resistance value at the time of applying an alternating current signal of 1 kHz is regularly measured, the rate of change of the internal resistance value can be derived based on the operation history data stored in the primary use history database 22c.

The remaining performance estimation unit 21c estimates the period from when the secondary use of the secondary battery 5 is started until when the use limit point based on constant storage deterioration and cycle deterioration is reached or the period from when the secondary use is started until when the sudden deterioration point is reached, whichever is shorter, as a remaining life period of the secondary battery 5.

The remaining performance estimation unit 21c can convert the remaining life period of the secondary battery 5 into at least one of chargeable/dischargeable capacity and chargeable/dischargeable electric energy. The remaining performance estimation unit 21c displays the remaining performance of the secondary battery 5 represented by at least one of the remaining period, the chargeable/dischargeable capacity, and the remaining chargeable/dischargeable electric energy on a display unit (not shown) of the arithmetic unit 20. By learning the remaining performance of the secondary battery 5, a car dealer, a maker, a used car distributor, or a user can evaluate the current economical value of the secondary battery 5.

The remaining performance estimation unit 21c may display on the display unit that the secondary battery 5 cannot be reused when the estimated remaining performance of the secondary battery 5 is less than a reference value.

Figure 4:
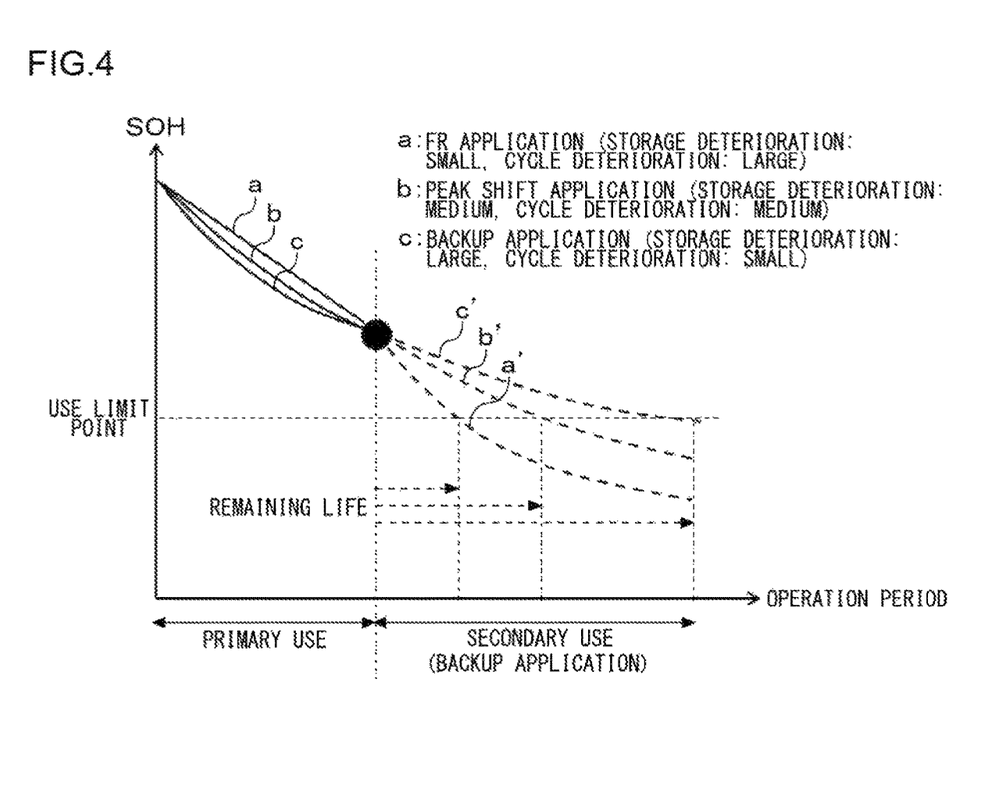
FIG. 4 is a diagram showing, as a specific example, the effect of the purpose of the secondary battery at the time of the primary use on the deterioration prediction curve of the secondary battery during the secondary use period.

FIG. 4 is a diagram showing, as a specific example, the effect of the application of the secondary battery 5 at the time of the primary use on the deterioration prediction curve of the secondary battery 5 during the secondary use period. In this example, both the primary use product 1 and the secondary use product 2 are stationary-type power storage systems. A deterioration prediction curve a is a deterioration prediction curve when the secondary battery is used for an FR application during the primary use and for a backup application during the secondary use. A deterioration prediction curve b is a deterioration prediction curve when the secondary battery is used for a peak shift application during the primary use and for a backup application during the secondary use. A deterioration prediction curve c is a deterioration prediction curve when the secondary battery is used for a backup application during both the primary use and the secondary use.

FR is control where charging and discharging for the system are repeated in order to stabilize the frequency of the system. Therefore, in an FR application, since the frequency of charging and discharging is high, the cycle deterioration is relatively larger than the storage deterioration. Backup is for storing electric power in case of power failure of the system and occupied mostly by resting time. Therefore, in a backup application, the cycle deterioration is small, and the storage deterioration is relatively large. Peak shift is for charging from the system at night and discharging to the load during the day. In the peak shift, basically, charging is done once a day, and discharging is done once a day. Therefore, in peak shift, cycle deterioration and storage deterioration are moderate.

In the present embodiment, through the deterioration diagnosis of the secondary battery 5 that has already been used for the primary use, the details of the deterioration degree of the storage deterioration and the deterioration degree of the cycle deterioration due to the primary use can be determined. In the example shown in FIG. 4, since the application at the time of the secondary use is backup, the storage deterioration contributes significantly during the secondary use. When the application at the time of the primary use is also backup, since the storage deterioration generally progressing at a deterioration speed according to the 0.5 power law has already progressed, the curve enters a zone where the inclination of the deterioration speed becomes gentle. Therefore, when the application at the time of the primary use is backup and the application at the time of the secondary use is also backup, the deterioration speed at the time of the secondary use becomes slow, and the remaining life in the secondary use becomes long.

On the other hand, when the application at the time of the primary use is FR, the storage deterioration has not progressed. Therefore, when the application at the time of the secondary use is backup, the effect of a zone where the inclination of the deterioration speed of the storage deterioration is steep is large. Therefore, when the application at the time of the primary use is FR and the application at the time of the secondary use is backup, the remaining life in the secondary use is short. When the application at the time of the primary use is peak shift and the application at the time of the secondary use is backup, the remaining life in the secondary use is in the middle of the two.

As described above, according to the present embodiment, by performing deterioration diagnosis on the secondary battery 5 that has already been used for the primary use and estimating the deterioration prediction curve obtained at the time of the secondary use based on the deterioration diagnosis result, the remaining performance of the secondary battery 5 can be estimated with high accuracy. Since the deterioration state of the secondary battery 5 that has already been used for the primary use is estimated based on the actual measurement value, the operation history data of the secondary battery 5 in the primary use product 1 is not essential. Therefore, the secondary battery 5 used in the primary use product 1 that does not have the function of recording the operation history data of the secondary battery 5 can also be subjected to remaining performance estimation.

By performing nondestructive deterioration diagnosis (without disassembling the secondary battery 5) immediately before the secondary use of the secondary battery 5, the influence of the storage deterioration in a stock period from the end of the primary use to the start of the secondary use can be also reflected in the remaining performance estimation. Further, since the time of occurrence of the sudden deterioration due to a decrease in the electrolyte is also predicted, the remaining life after the start of secondary use can be predicted with high accuracy.

Described above is an explanation based on the embodiments of the present disclosure. The embodiments are intended to be illustrative only, and it will be obvious to those skilled in the art that various modifications to constituting elements and processes could be developed and that such modifications are also within the scope of the present disclosure.

For example, before the secondary use of the secondary battery 5 is started, the deterioration speed update unit 21b of the arithmetic unit 20 may newly derive the deterioration power law of the deterioration speed of the storage deterioration based on the operation history data of the secondary battery 5 during the primary use period. The deterioration power law of the deterioration speed of the storage deterioration of the secondary battery 5 may deviate from a value derived by the preliminary evaluation due to individual differences, characteristic changes after use, and the like of the secondary battery 5. When the operation history data includes measurement data regarding temperature, SOC, time, and SOH, the deterioration power law n is derived by back-calculating the deterioration speed k (T,SOC) of the storage deterioration to be a linear function. When the derived deterioration power law n is different from the deterioration power law n derived in the preliminary evaluation, the above-mentioned Equation 3 is calculated using the newly derived deterioration power law n.

In the same way, the deterioration power law of the deterioration speed of the cycle deterioration of the secondary battery 5 may be newly derived based on the operation history data of the secondary battery 5 during the primary use period. Using the operation history data, the deterioration power law n is derived by back-calculating the deterioration speed k (T,SOC range, C) of the cycle deterioration to be a linear function. When the derived deterioration power law n is different from the deterioration power law n derived in the preliminary evaluation, the above-mentioned Equation 4 is calculated using the newly derived deterioration power law n.

By strictly estimating the deterioration power law of the deterioration speed of the storage deterioration and the deterioration power law of the deterioration speed of the cycle deterioration and updating the deterioration power laws appropriately as described, the deterioration degree of the storage deterioration and the deterioration degree of the cycle deterioration can be estimated with higher accuracy compared to a case where fixed values are used for the deterioration power laws.

The embodiment may be specified by the following items.

[Item 1]

A secondary battery remaining performance evaluation program embedded on a non-transitory computer-readable recording medium, including:

a module that diagnoses the deterioration degree of a secondary battery that has already been used for primary use based on an actual measurement value;

a module that updates the deterioration speed of the secondary battery based on the diagnosis result of the secondary battery; and a module that estimates the remaining performance of the secondary battery after the start of secondary use based on the updated deterioration speed and a usage method at the time of the secondary use of the secondary battery.

According to this, the remaining performance of a secondary battery that has already been used for primary use can be highly accurately estimated.

[Item 2]

The secondary battery remaining performance evaluation program according to Item 1, wherein the deterioration degree of the secondary battery includes the deterioration degree of storage deterioration and the deterioration degree of cycle deterioration, and the module that updates the deterioration speed updates the deterioration speed of the storage deterioration and the deterioration speed of the cycle deterioration individually.

Taking into consideration the details of the storage deterioration and the cycle deterioration, the remaining performance of a secondary battery that has already been used for primary use can be highly accurately estimated.

[Item 3]

The secondary battery remaining performance evaluation program according to Item 1 or Item 2, wherein the deterioration degree of the secondary battery is defined by the sum of the deterioration degree of storage deterioration and the deterioration degree of cycle deterioration, the module that diagnoses the deterioration degree diagnoses the details of the deterioration degree of the storage deterioration and the deterioration degree of the cycle deterioration, and the module that updates the deterioration speed updates the deterioration speed of the storage deterioration and the deterioration speed of the cycle deterioration individually based on the details.

By estimating the details of the storage deterioration and the cycle deterioration based on the actual measurement value, the remaining performance of the secondary battery that has already been used for primary use can be highly accurately estimated.

[Item 4]

The secondary battery remaining performance evaluation program according to Item 3, wherein the module that diagnoses the deterioration degree executes capacity measurement of the secondary battery and at least one of dV/dQ measurement, alternating current impedance measurement, and direct current resistance measurement in addition to the capacity measurement, and, based on the result of the execution, diagnoses the details of the deterioration degree of the storage deterioration and the deterioration degree of the cycle deterioration.

By using a plurality of diagnosis methods in combination, the details of the storage deterioration and the cycle deterioration can be estimated with high accuracy.

[Item 5]

The secondary battery remaining performance evaluation program according to any one of Item 1 through Item 4, further including:

a module that acquires operation history of the secondary battery at the time of the primary use, wherein, when the deterioration power law of the deterioration speed of the secondary battery evaluated preliminarily before the primary use and the deterioration power law of the deterioration speed of the secondary battery derived based on the operation history at the time of the primary use are different, the module that updates the deterioration speed updates the deterioration power law to the deterioration power law of the deterioration speed of the secondary battery derived based on the operation history at the time of the primary use.

By setting the deterioration power law of the deterioration speed to be an optimum value, the remaining performance of the secondary battery that has already been used for the primary use can be highly accurately estimated.

[Item 6]

The secondary battery remaining performance evaluation program according to any one of Item 1 through Item 5, wherein the secondary battery is used for in-vehicle application when used for the primary use and used for a usage method requiring a lighter load than that at the time of the primary use when used for the secondary use.

This allows the period of the entire life cycle of the secondary battery to be elongated.

[Item 7]

The secondary battery remaining performance evaluation program according to Item 6, wherein at the time of the secondary use of the secondary battery, at least one of a lower upper limit of the used state of charge (SOC) range, a higher lower limit of the used SOC range, a lower charging rate, a lower discharging rate, and a longer resting time than those at the time of the primary use is satisfied.

This allows the load at the time of the secondary use of the secondary battery to be reduced.

[Item 8]

The secondary battery remaining performance evaluation program according to any one of Item 1 through Item 7, wherein the module that estimates the remaining performance outputs remaining performance after the start of the secondary use of the secondary battery, using at least one of a period from when the secondary use of the secondary battery is started until when an end point of use is reached, chargeable/dischargeable capacity, and chargeable/dischargeable electric energy.

This allows the value of the secondary battery that has already been used for the primary use to be converted into a numerical value.

[Item 9]

The secondary battery remaining performance evaluation program according to any one of Item 1 through Item 8, wherein the module that estimates the remaining performance estimates the remaining performance from the start of the secondary use of the secondary battery to a sudden deterioration point that occurs at the end of use of the secondary battery based on the diagnosis result of the secondary battery, and determines the remaining performance of the secondary battery based on the end point of use of the secondary battery, which is based on the storage deterioration and the cycle deterioration, or on the sudden deterioration point, whichever is reached first.

This allows the remaining life of the secondary battery to be estimated with high accuracy.

[Item 10]

The secondary battery remaining performance evaluation program according to any one of Item 1 through Item 9, wherein the deterioration degree of the secondary battery includes the deterioration degree of storage deterioration and the deterioration degree of cycle deterioration, and the secondary battery is a battery module that includes a plurality of cells, and the module that estimates the remaining performance sets the SOC range of the battery module to an SOC range defined by the maximum upper limit value and the minimum lower limit value of the SOC ranges of the plurality of cells and estimates the cycle deterioration of the battery module based on the SOC range.

This can prevent the deterioration degree of the cycle deterioration from being estimated to be too small.

[Item 11]

An arithmetic unit (20) including:

a deterioration diagnosis unit (21a) that diagnoses the deterioration degree of a secondary battery that has already been used for primary use based on an actual measurement value;

a deterioration speed update unit (21b) that updates the deterioration speed of the secondary battery based on the diagnosis result of the secondary battery; and a remaining performance estimation unit (21c) that estimates the remaining performance of the secondary battery after the start of secondary use based on the updated deterioration speed and a usage method at the time of the secondary use of the secondary battery.

According to this, the remaining performance of a secondary battery that has already been used for primary use can be highly accurately estimated.

[Item 12]

The arithmetic unit (20) according to Item 11, wherein the deterioration degree of the secondary battery includes the deterioration degree of storage deterioration and the deterioration degree of cycle deterioration, and the deterioration speed update unit (21b) updates the deterioration speed of the storage deterioration and the deterioration speed of the cycle deterioration individually.

Taking into consideration the details of the storage deterioration and the cycle deterioration, the remaining performance of a secondary battery that has already been used for primary use can be highly accurately estimated.

[Item 13]

The arithmetic unit (20) according to Item 11 or 12, wherein the deterioration degree of the secondary battery is defined by the sum of the deterioration degree of storage deterioration and the deterioration degree of cycle deterioration, the deterioration diagnosis unit (21a) diagnoses the details of the deterioration degree of the storage deterioration and the deterioration degree of the cycle deterioration, and the deterioration speed update unit (21b) updates the deterioration speed of the storage deterioration and the deterioration speed of the cycle deterioration individually based on the details.

By estimating the details of the storage deterioration and the cycle deterioration based on the actual measurement value, the remaining performance of the secondary battery that has already been used for primary use can be highly accurately estimated.

[Item 14]

The arithmetic unit (20) according to Item 13, wherein the deterioration diagnosis unit 21a executes capacity measurement of the secondary battery and at least one of dV/dQ measurement, alternating current impedance measurement, and direct current resistance measurement in addition to the capacity measurement, and, based on the result of the execution, diagnoses the details of the deterioration degree of the storage deterioration and the deterioration degree of the cycle deterioration.

By using a plurality of diagnosis methods in combination, the details of the storage deterioration and the cycle deterioration can be estimated with high accuracy.

[Item 15]

The arithmetic unit (20) according to any one of Item 11 through Item 14, wherein the remaining performance estimation unit (21c) acquires the operation history of the secondary battery at the time of the primary use, and wherein, when the deterioration power law of the deterioration speed of the secondary battery evaluated preliminarily before the primary use and the deterioration power law of the deterioration speed of the secondary battery derived based on the operation history at the time of the primary use are different, the deterioration speed update unit (21b) updates the deterioration power law to the deterioration power law of the deterioration speed of the secondary battery derived based on the operation history at the time of the primary use.

By setting the deterioration power law of the deterioration speed to be an optimum value, the remaining performance of the secondary battery that has already been used for the primary use can be highly accurately estimated.

[Item 16]

The arithmetic unit (20) according to any one of Item 11 through Item 15, wherein the secondary battery is used for in-vehicle application when used for the primary use and used for a usage method requiring a lighter load than that at the time of the primary use when used for the secondary use.

This allows the period of the entire life cycle of the secondary battery to be elongated.

[Item 17]

The arithmetic unit (20) according to Item 16, wherein at the time of the secondary use of the secondary battery, at least one of a lower upper limit of the used state of charge (SOC) range, a higher lower limit of the used SOC range, a lower charging rate, a lower discharging rate, and a longer resting time than those at the time of the primary use is satisfied.

This allows the load at the time of the secondary use of the secondary battery to be reduced.

[Item 18]

The arithmetic unit (20) according to any one of Item 11 through Item 17, wherein the remaining performance estimation unit (21c) outputs remaining performance after the start of the secondary use of the secondary battery, using at least one of a period from when the secondary use of the secondary battery is started until when an end point of use is reached, chargeable/dischargeable capacity, and chargeable/dischargeable electric energy.

This allows the value of the secondary battery that has already been used for the primary use to be converted into a numerical value.

[Item 19]

The arithmetic unit (20) according to any one of Item 11 through Item 18, wherein the remaining performance estimation unit (21c) estimates the remaining performance from the start of the secondary use of the secondary battery to a sudden deterioration point that occurs at the end of use of the secondary battery based on the diagnosis result of the secondary battery, and determines the remaining performance of the secondary battery based on the end point of use of the secondary battery, which is based on the storage deterioration and the cycle deterioration, or on the sudden deterioration point, whichever is reached first.

This allows the remaining life of the secondary battery to be estimated with high accuracy.

[Item 20]

The arithmetic unit (20) according to any one of Item 11 through Item 19, wherein the deterioration degree of the secondary battery includes the deterioration degree of storage deterioration and the deterioration degree of cycle deterioration, and the secondary battery is a battery module that includes a plurality of cells, and the remaining performance estimation unit (21c) sets the SOC range of the battery module to an SOC range defined by the maximum upper limit value and the minimum lower limit value of the SOC ranges of the plurality of cells and estimates the cycle deterioration of the battery module based on the SOC range.

This can prevent the deterioration degree of the cycle deterioration from being estimated to be too small.

[Item 21]

A remaining performance evaluation system (3) including:

a measuring device (10) that measures the state of a secondary battery that has already been used for primary use; and an arithmetic unit (20) that evaluates the remaining performance of the secondary battery based on data measured by the measuring device (10), wherein the arithmetic unit (20) includes:

a deterioration diagnosis unit (21a) that diagnoses the deterioration degree of the secondary battery based on the data measured by the measuring device (10);

a deterioration speed update unit (21b) that updates the deterioration speed of the secondary battery based on the diagnosis result of the secondary battery; and a remaining performance estimation unit (21c) that estimates the remaining performance of the secondary battery after the start of secondary use based on the updated deterioration speed and a usage method at the time of the secondary use of the secondary battery.

According to this, the remaining performance of a secondary battery that has already been used for primary use can be highly accurately estimated.

[Item 22]

The remaining performance evaluation system (3) according to Item 21, wherein the deterioration degree of the secondary battery includes the deterioration degree of storage deterioration and the deterioration degree of cycle deterioration, and the deterioration speed update unit (21b) updates the deterioration speed of the storage deterioration and the deterioration speed of the cycle deterioration individually.

Taking into consideration the details of the storage deterioration and the cycle deterioration, the remaining performance of a secondary battery that has already been used for primary use can be highly accurately estimated.

[Item 23]

The remaining performance evaluation system (3) according to Item 21 or 22, wherein the deterioration degree of the secondary battery is defined by the sum of the deterioration degree of storage deterioration and the deterioration degree of cycle deterioration, the deterioration diagnosis unit (21a) diagnoses the details of the deterioration degree of the storage deterioration and the deterioration degree of the cycle deterioration, and the deterioration speed update unit (21b) updates the deterioration speed of the storage deterioration and the deterioration speed of the cycle deterioration individually based on the details.

By estimating the details of the storage deterioration and the cycle deterioration based on the actual measurement value, the remaining performance of the secondary battery that has already been used for primary use can be highly accurately estimated.

[Item 24]

The remaining performance evaluation system (3) according to Item 23, wherein the deterioration diagnosis unit (21a) executes capacity measurement of the secondary battery and at least one of dV/dQ measurement, alternating current impedance measurement, and direct current resistance measurement in addition to the capacity measurement, and, based on the result of the execution, diagnoses the details of the deterioration degree of the storage deterioration and the deterioration degree of the cycle deterioration.

By using a plurality of diagnosis methods in combination, the details of the storage deterioration and the cycle deterioration can be estimated with high accuracy.

[Item 25]

The remaining performance evaluation system (3) according to any one of Item 21 through 24, wherein the remaining performance estimation unit (21c) acquires the operation history of the secondary battery at the time of the primary use, and when the deterioration power law of the deterioration speed of the secondary battery evaluated preliminarily before the primary use and the deterioration power law of the deterioration speed of the secondary battery derived based on the operation history at the time of the primary use are different, the deterioration speed update unit (21b) updates the deterioration power law to the deterioration power law of the deterioration speed of the secondary battery derived based on the operation history at the time of the primary use.

By setting the deterioration power law of the deterioration speed to be an optimum value, the remaining performance of the secondary battery that has already been used for the primary use can be highly accurately estimated.

[Item 26]

The remaining performance evaluation system (3) according to any one of Item 21 through 25, wherein the secondary battery is used for in-vehicle application when used for the primary use and used for a usage method requiring a lighter load than that at the time of the primary use when used for the secondary use.

This allows the period of the entire life cycle of the secondary battery to be elongated.

[Item 27]

The remaining performance evaluation system (3) according to Item 26, wherein at the time of the secondary use of the secondary battery, at least one of a lower upper limit of the used state of charge (SOC) range, a higher lower limit of the used SOC range, a lower charging rate, a lower discharging rate, and a longer resting time than those at the time of the primary use is satisfied.

This allows the load at the time of the secondary use of the secondary battery to be reduced.

[Item 28]

The remaining performance evaluation system (3) according to any one of Item 21 through 27, wherein the remaining performance estimation unit (21c) outputs remaining performance after the start of the secondary use of the secondary battery, using at least one of a period from when the secondary use of the secondary battery is started until when an end point of use is reached, chargeable/dischargeable capacity, and chargeable/dischargeable electric energy.

This allows the value of the secondary battery that has already been used for the primary use to be converted into a numerical value.

[Item 29]

The remaining performance evaluation system (3) according to any one of Item 21 through 28, wherein the remaining performance estimation unit (21c) estimates the remaining performance from the start of the secondary use of the secondary battery to a sudden deterioration point that occurs at the end of use of the secondary battery based on the diagnosis result of the secondary battery, and determines the remaining performance of the secondary battery based on the end point of use of the secondary battery, which is based on the storage deterioration and the cycle deterioration, or on the sudden deterioration point, whichever is reached first.

This allows the remaining life of the secondary battery to be estimated with high accuracy.

[Item 30]

The remaining performance evaluation system (3) according to any one of Item 21 through 29, wherein the deterioration degree of the secondary battery includes the deterioration degree of storage deterioration and the deterioration degree of cycle deterioration, the secondary battery is a battery module that includes a plurality of cells, and the remaining performance estimation unit (21c) sets the SOC range of the battery module to an SOC range defined by the maximum upper limit value and the minimum lower limit value of the SOC ranges of the plurality of cells and estimates the cycle deterioration of the battery module based on the SOC range.

This can prevent the deterioration degree of the cycle deterioration from being estimated to be too small.

[Item 31]

A secondary battery remaining performance evaluation method including:

diagnosing the deterioration degree of a secondary battery that has already been used for primary use based on an actual measurement value;

updating the deterioration speed of the secondary battery based on the diagnosis result of the secondary battery; and estimating the remaining performance of the secondary battery after the start of secondary use based on the updated deterioration speed and a usage method at the time of the secondary use of the secondary battery.

According to this, the remaining performance of a secondary battery that has already been used for primary use can be highly accurately estimated.

[Item 32]

The secondary battery remaining performance evaluation method according to Item 31, wherein the deterioration degree of the secondary battery includes the deterioration degree of storage deterioration and the deterioration degree of cycle deterioration, and in the updating of the deterioration speed, the deterioration speed of the storage deterioration and the deterioration speed of the cycle deterioration are individually updated.

Taking into consideration the details of the storage deterioration and the cycle deterioration, the remaining performance of a secondary battery that has already been used for primary use can be highly accurately estimated.

[Item 33]

The secondary battery remaining performance evaluation method according to Item 31 or 32, wherein the deterioration degree of the secondary battery is defined by the sum of the deterioration degree of storage deterioration and the deterioration degree of cycle deterioration, in the diagnosing, the details of the deterioration degree of the storage deterioration and the deterioration degree of the cycle deterioration are diagnosed, and in the updating of the deterioration speed, the deterioration speed of the storage deterioration and the deterioration speed of the cycle deterioration are individually updated based on the details.

By estimating the details of the storage deterioration and the cycle deterioration based on the actual measurement value, the remaining performance of the secondary battery that has already been used for primary use can be highly accurately estimated.

[Item 34]

The secondary battery remaining performance evaluation method according to Item 33, wherein in the diagnosing, capacity measurement of the secondary battery and at least one of dV/dQ measurement, alternating current impedance measurement, and direct current resistance measurement in addition to the capacity measurement is executed, and, based on the result of the execution, the details of the deterioration degree of the storage deterioration and the deterioration degree of the cycle deterioration are diagnosed.

By using a plurality of diagnosis methods in combination, the details of the storage deterioration and the cycle deterioration can be estimated with high accuracy.

[Item 35]

The secondary battery remaining performance evaluation method according to any one of Item 31 through Item 34, further including:

acquiring operation history of the secondary battery at the time of the primary use, wherein, when the deterioration power law of the deterioration speed of the secondary battery evaluated preliminarily before the primary use and the deterioration power law of the deterioration speed of the secondary battery derived based on the operation history at the time of the primary use are different, in the updating of the deterioration speed, the deterioration power law is updated to the deterioration power law of the deterioration speed of the secondary battery derived based on the operation history at the time of the primary use.

By setting the deterioration power law of the deterioration speed to be an optimum value, the remaining performance of the secondary battery that has already been used for the primary use can be highly accurately estimated.

[Item 36]

The secondary battery remaining performance evaluation method according to any one of Item 31 through Item 35, wherein the secondary battery is used for in-vehicle application when used for the primary use and used for a usage method requiring a lighter load than that at the time of the primary use when used for the secondary use.

This allows the period of the entire life cycle of the secondary battery to be elongated.

[Item 37]

The secondary battery remaining performance evaluation method according to Item 36, wherein at the time of the secondary use of the secondary battery, at least one of a lower upper limit of the used state of charge (SOC) range, a higher lower limit of the used SOC range, a lower charging rate, a lower discharging rate, and a longer resting time than those at the time of the primary use is satisfied.

This allows the load at the time of the secondary use of the secondary battery to be reduced.

[Item 38]

The secondary battery remaining performance evaluation method according to any one of Item 31 through Item 37, wherein in the estimating of the remaining performance, remaining performance after the start of the secondary use of the secondary battery is output using at least one of a period from when the secondary use of the secondary battery is started until when an end point of use is reached, chargeable/dischargeable capacity, and chargeable/dischargeable electric energy.

This allows the value of the secondary battery that has already been used for the primary use to be converted into a numerical value.

[Item 39]

The secondary battery remaining performance evaluation method according to any one of Item 31 through Item 38, wherein in the estimating of the remaining performance, the remaining performance from the start of the secondary use of the secondary battery to a sudden deterioration point that occurs at the end of use of the secondary battery is estimated based on the diagnosis result of the secondary battery, and the remaining performance of the secondary battery is determined based on the end point of use of the secondary battery, which is based on the storage deterioration and the cycle deterioration, or on the sudden deterioration point, whichever is reached first.

This allows the remaining life of the secondary battery to be estimated with high accuracy.

[Item 40]

The secondary battery remaining performance evaluation method according to any one of Item 31 through Item 39, wherein the deterioration degree of the secondary battery includes the deterioration degree of storage deterioration and the deterioration degree of cycle deterioration, the secondary battery is a battery module that includes a plurality of cells, and in the estimating of the remaining performance, the SOC range of the battery module is set to an SOC range defined by the maximum upper limit value and the minimum lower limit value of the SOC ranges of the plurality of cells, and the cycle deterioration of the battery module is estimated based on the SOC range.

This can prevent the deterioration degree of the cycle deterioration from being estimated to be too small.

REFERENCE SIGNS LIST 1 primary use product
1a management unit
1b history database
2 secondary use product
2a management unit
2b history database
5 secondary battery
3 remaining performance evaluation system
10 measuring device
11 power supply circuit
12 current sensor
13 voltage sensor
14 communication unit
20 arithmetic unit
21 control unit
21a deterioration diagnosis unit
21b deterioration speed update unit
21c remaining performance estimation unit
22 storage unit
22a primary use deterioration database
22b measured data database
22c primary use history database
22d secondary use deterioration database
23 communication unit
24 external media installation unit

The invention claimed is:

1. A secondary battery remaining performance evaluation system comprising:

one or more processors configured to:

diagnose a deterioration degree of a secondary battery that has been mounted on a primary use product and has already been used for primary use based on an actual measurement value;

update a deterioration speed of the secondary battery based on the diagnosis result of the secondary battery; and estimate a remaining performance of the secondary battery after a start of secondary use based on the updated deterioration speed and a usage method at a time of the secondary use of the secondary battery mounted on a secondary use product, wherein the one or more processors executes capacity measurement of the secondary battery and dV/dQ measurement in addition to the capacity measurement, and diagnoses, based on a result of the execution, details of the deterioration degree of storage deterioration and the deterioration degree of cycle deterioration.

2. The secondary battery remaining performance evaluation system according to claim 1, wherein
the deterioration degree of the secondary battery includes the deterioration degree of storage deterioration and the deterioration degree of cycle deterioration, and
the one or more processors update the deterioration speed of the storage deterioration and the deterioration speed of the cycle deterioration individually.

3. The secondary battery remaining performance evaluation system according to claim 1, wherein
the deterioration degree of the secondary battery is defined by a sum of the deterioration degree of the storage deterioration and the deterioration degree of the cycle deterioration, and
the one or more processors update the deterioration speed of the storage deterioration and the deterioration speed of the cycle deterioration individually based on the details.

4. The secondary battery remaining performance evaluation system according to claim 1,
wherein the one or more processors are configured to:
acquire operation history of the secondary battery at the time of the primary use,
wherein, when the deterioration power law of the deterioration speed of the secondary battery evaluated preliminarily before the primary use and the deterioration power law of the deterioration speed of the secondary battery derived based on the operation history at the time of the primary use are different, the one or more processors update the deterioration speed updates the deterioration power law to the deterioration power law of the deterioration speed of the secondary battery derived based on the operation history at the time of the primary use.

5. The secondary battery remaining performance evaluation system according to claim 1, wherein
the secondary battery is used for in-vehicle application when used for the primary use and used for a usage method requiring a lighter load than that at the time of the primary use when used for the secondary use.

6. The secondary battery remaining performance evaluation system according to claim 1, wherein
the one or more processors estimate remaining performance after the start of the secondary use of the secondary battery, using at least one of a period from when the secondary use of the secondary battery is started until when an end point of use is reached, chargeable/dischargeable capacity, and chargeable/dischargeable electric energy.

7. The secondary battery remaining performance evaluation system according to claim 1, wherein
the one or more processors estimate the remaining performance from the start of the secondary use of the secondary battery to a sudden deterioration point of the capacity due to a decrease in electrolyte that occurs at an end of use of the secondary battery based on the diagnosis result of the secondary battery, and determine the remaining performance of the secondary battery based on an end point of use of the secondary battery, which is based on the storage deterioration and the cycle deterioration, or on the sudden deterioration point, whichever is reached first.

8. The secondary battery remaining performance evaluation system according to claim 1, wherein
the deterioration degree of the secondary battery includes the deterioration degree of storage deterioration and the deterioration degree of cycle deterioration,
the secondary battery is a battery module that includes a plurality of cells, and
the one or more processors set a SOC range of the battery module to an SOC range defined by an upper limit of each maximum upper limit value and a lower limit of each minimum lower limit value of the SOC ranges of the plurality of cells and estimate the cycle deterioration of the battery module based on the SOC range.

9. The secondary battery remaining performance evaluation system according to claim 6, wherein
at the time of the secondary use of the secondary battery, at least one of a lower upper limit of a used state of charge (SOC) range, a higher lower limit of the used SOC range, a lower charging rate, a lower discharging rate, and a longer resting time than those at the time of the primary use is satisfied.

10. An arithmetic unit for secondary battery remaining performance evaluation, the arithmetic unit comprising:
a deterioration diagnosis unit that diagnoses a deterioration degree of a secondary battery that has been mounted on a primary use product and has already been used for primary use based on an actual measurement value;
a deterioration speed update unit that updates a deterioration speed of the secondary battery based on the diagnosis result of the secondary battery; and
a remaining performance estimation unit that estimates a remaining performance of the secondary battery after a start of secondary use based on the updated deterioration speed and a usage method at a time of the secondary use of the secondary battery mounted on a secondary use product,
wherein the arithmetic unit executes capacity measurement of the secondary battery and dV/dQ measurement in addition to the capacity measurement, and diagnoses, based on a result of the execution, details of the deterioration degree of storage deterioration and the deterioration degree of cycle deterioration.

11. A remaining performance evaluation system for secondary battery remaining performance evaluation, the remaining performance evaluation system comprising:
a measuring device that measures a state of a secondary battery that has been mounted on a primary use product and has already been used for primary use; and
an arithmetic unit that evaluates a remaining performance of the secondary battery based on data measured by the measuring device, wherein the arithmetic unit includes:
a deterioration diagnosis unit that diagnoses a deterioration degree of the secondary battery based on the data measured by the measuring device;
a deterioration speed update unit that updates a deterioration speed of the secondary battery based on the diagnosis result of the secondary battery; and
a remaining performance estimation unit that estimates the remaining performance of the secondary battery after a start of secondary use based on the updated deterioration speed and a usage method at a time of the secondary use of the secondary battery mounted on a secondary use product, wherein the arithmetic unit executes capacity measurement of the secondary battery and dV/dQ measurement in addition to the capacity measurement, and diagnoses, based on a result of the execution, details of the deterioration degree of storage deterioration and the deterioration degree of cycle deterioration.

12. A secondary battery remaining performance evaluation method comprising:
   diagnosing a deterioration degree of a secondary battery that has been mounted on a primary use product and has already been used for primary use based on an actual measurement value;
   updating a deterioration speed of the secondary battery based on the diagnosis result of the secondary battery;
   estimating a remaining performance of the secondary battery after a start of secondary use based on the updated deterioration speed and a usage method at a time of the secondary use of the secondary battery mounted on a secondary use product; and
   executing capacity measurement of the secondary battery and dV/dQ measurement in addition to the capacity measurement, and diagnosing, based on a result of the execution, details of the deterioration degree of storage deterioration and the deterioration degree of cycle deterioration.

* * * * *